United States Patent
Olson et al.

(10) Patent No.: US 9,722,544 B2
(45) Date of Patent: Aug. 1, 2017

(54) AUDIO SYSTEM HAVING AN IMPROVED EFFICIENCY AND EXTENDED OPERATION TIME

(71) Applicant: Logitech Europe S.A, Lausanne (CH)

(72) Inventors: Alan Olson, Vancouver, WA (US); Sean Chiu, Newark, CA (US); Jianhua Pan, Newark, CA (US); Constantine Mouzakis, Newark, CA (US); Jeffrey Anderson, Camas, WA (US); Patrick Nicolet, Mountain View, CA (US)

(73) Assignee: Logitech Europe S.A., Lausanne (CH)

( * ) Notice: Subject to any disclaimer, the term of this patent is extended or adjusted under 35 U.S.C. 154(b) by 0 days.

(21) Appl. No.: 15/367,228

(22) Filed: Dec. 2, 2016

(65) Prior Publication Data

US 2017/0085225 A1  Mar. 23, 2017

Related U.S. Application Data

(63) Continuation of application No. 14/804,253, filed on Jul. 20, 2015, now Pat. No. 9,559,642.
(Continued)

(51) Int. Cl.
*H03F 99/00* (2009.01)
*H03F 1/02* (2006.01)
(Continued)

(52) U.S. Cl.
CPC ............ *H03F 1/0227* (2013.01); *H03F 3/185* (2013.01); *H03F 3/2171* (2013.01); *H04R 3/007* (2013.01);
(Continued)

(58) Field of Classification Search
CPC ........... H03F 2200/03; H03F 2200/102; H03F 2200/252; H03F 2200/261;
(Continued)

(56) References Cited

U.S. PATENT DOCUMENTS

| 4,218,660 A | 8/1980 | Carver |
| 4,409,559 A | 10/1983 | Amada et al. |

(Continued)

FOREIGN PATENT DOCUMENTS

| EP | 906660 A1 | 4/1999 |
| EP | 1107095 A2 | 6/2001 |

(Continued)

OTHER PUBLICATIONS

Class-D Amplifier. Wikipedia. Retrieved Oct. 22, 2014 from http://en.wikipedia.org/wiki/Class-D_amplifier.

(Continued)

*Primary Examiner* — Thang Tran

(74) *Attorney, Agent, or Firm* — Patterson + Sheridan, LLP

(57) ABSTRACT

Embodiments of the disclosure may include a method and apparatus for improving the efficiency and extending the operation time between recharges or replacement batteries of a portable audio delivery system. The audio delivery system may include a processor, an audio processing device, a speaker, and a rechargeable power source. The audio delivery system is generally configured to generate and/or receive an audio input signal and efficiently deliver an amplified, high quality audio output signal to a user. In some embodiments of the disclosure, the audio processing device of the audio delivery system may include a switch mode power supply (SMPS), a signal delay element, an envelope detector, and a switching signal amplifier.

20 Claims, 10 Drawing Sheets

Related U.S. Application Data

(60) Provisional application No. 62/099,380, filed on Jan. 2, 2015.

(51) Int. Cl.
*H03F 3/185* (2006.01)
*H03F 3/217* (2006.01)
*H04R 29/00* (2006.01)
*H04R 3/00* (2006.01)

(52) U.S. Cl.
CPC ....... *H04R 29/001* (2013.01); *H03F 2200/03* (2013.01); *H03F 2200/102* (2013.01); *H03F 2200/435* (2013.01)

(58) Field of Classification Search
CPC ............. H03F 2200/435; H03F 1/0222; H03F 1/0227; H03F 3/68; H03F 3/185; H03F 3/217; H03F 3/2171; H03F 2203/21196; H04R 3/00; H03L 7/087
See application file for complete search history.

(56) References Cited

U.S. PATENT DOCUMENTS

| | | |
|---|---|---|
| 4,586,002 A | 4/1986 | Carver |
| 5,075,634 A | 12/1991 | French |
| 5,126,688 A | 6/1992 | Nakanishi et al. |
| 5,396,194 A | 3/1995 | Williamson et al. |
| 5,510,753 A | 4/1996 | French |
| 5,917,369 A | 6/1999 | Nguyen |
| 5,932,827 A | 8/1999 | Osborne et al. |
| 5,942,935 A | 8/1999 | Okanobu |
| 5,949,282 A | 9/1999 | Nguyen et al. |
| 5,959,501 A | 9/1999 | Chester |
| 5,963,106 A | 10/1999 | Blyth et al. |
| 5,973,368 A | 10/1999 | Pearce et al. |
| 5,973,569 A | 10/1999 | Nguyen |
| 6,104,248 A | 8/2000 | Carver |
| 6,160,455 A | 12/2000 | French et al. |
| 6,256,482 B1 | 7/2001 | Raab |
| 6,288,523 B2 | 9/2001 | Antoszkiewicz |
| 6,373,340 B1 | 4/2002 | Shashoua |
| 6,388,514 B1 | 5/2002 | King et al. |
| 6,538,514 B2 | 3/2003 | Harvey |
| 6,636,112 B1 | 10/2003 | McCune |
| 6,737,340 B2 | 5/2004 | Meier et al. |
| 6,750,705 B2 | 6/2004 | Knoedgen |
| 6,788,137 B2 | 9/2004 | Morita |
| 6,816,016 B2 | 11/2004 | Sander et al. |
| 6,873,275 B2 | 3/2005 | Komamura et al. |
| 7,321,262 B2 | 1/2008 | Nielsen et al. |
| 7,362,168 B2 | 4/2008 | French et al. |
| 7,714,660 B2 | 5/2010 | Lesso et al. |
| 8,093,951 B1 * | 1/2012 | Zhang ..................... H03F 3/217 330/251 |
| 8,279,001 B2 | 10/2012 | French et al. |
| 8,686,792 B2 * | 4/2014 | Sukegawa ............ H03F 1/3205 330/127 |
| 8,995,691 B2 | 3/2015 | French et al. |
| 2002/0030543 A1 | 3/2002 | French et al. |
| 2003/0035554 A1 | 2/2003 | Cho et al. |
| 2004/0036531 A1 | 2/2004 | Trevelyan |
| 2004/0263244 A1 | 12/2004 | Masuda et al. |
| 2005/0062527 A1 | 3/2005 | Saito et al. |
| 2008/0144861 A1 * | 6/2008 | Melanson ............... H03F 1/025 381/120 |
| 2014/0064518 A1 * | 3/2014 | Park ..................... H03G 3/3005 381/107 |

FOREIGN PATENT DOCUMENTS

| | | |
|---|---|---|
| WO | 0143276 A1 | 6/2001 |
| WO | 02073795 A2 | 9/2002 |
| WO | 03065570 A2 | 8/2003 |
| WO | 2005036731 A2 | 4/2005 |

OTHER PUBLICATIONS

Amplifier. Wikipedia. Retrieved Oct. 22, 2014 from http://en.wikipedia.org/wiki/Amplifier.

* cited by examiner

AUDIO SYSTEM HAVING AN IMPROVED EFFICIENCY AND EXTENDED OPERATION TIME

CROSS-REFERENCE TO RELATED APPLICATIONS

This application is a continuation of patent application Ser. No. 14/804,253, filed Jul. 20, 2015, which claims the benefit of U.S. provisional patent application Ser. No. 62/099,380, filed Jan. 2, 2015, which are both herein incorporated by reference.

BACKGROUND OF THE INVENTION

Field of the Invention

Embodiments of the present disclosure relate to a method and apparatus of delivering a high quality audio output from an audio device that is powered by a power source that has a limited energy storage capacity.

Description of the Related Art

The popularity of portable music players has increased dramatically in the past decade. Modern portable music players allow music enthusiasts to listen to music in a wide variety of different environments without requiring access to a wired power source. For example, a battery-operated portable music player such as an iPod® or a wireless speaker coupled to an iPod® or similar device is capable of playing music in a wide variety of locations without needing to be plugged in. Conventional portable music players and/or wireless speakers are typically designed to have a small form factor in order to increase portability. Accordingly, the batteries within such devices are usually small and only provide several hours of operation before the batteries need to be recharged or replaced.

As a result, the speakers within conventional portable music players and conventional wireless speakers often times have a dynamic range covering only a fraction of the frequency spectrum associated with most modern music. For example, modern music often includes a wide range of bass frequencies. However, the speakers within a conventional portable music player or wireless speaker usually cannot play all of the bass frequencies due to physical limitations of the speakers themselves, or because of the way the amplifying circuitry in the portable music player or wireless speaker are driven causes the useable power found in the batteries within the device to discharge rapidly. The power supply in conventional portable music players and wireless speakers is commonly limited by a finite energy storage capacity provided by the battery. The rate of energy consumption by the device determines the time of operation of the device until the battery needs to be recharged or replaced.

A power amplifier in an audio device receives an input signal, and using a power supply voltage, produces an output signal having the same shape but larger magnitude than the input signal. Typical conventional audio devices use linear types of power amplifiers, such as class A and AB amplifiers, due to simplicity and in most cases desirable sound quality is provided using these types of amplifiers. The efficiency of most of these analog amplifiers is poor, thus reducing the time of operation of the audio delivery device between charges of a battery-type power supply.

Power amplifiers are used in the output stages of audio devices to drive a loudspeaker load. Typical loudspeakers may have nominal impedance in a range between about 4 ohms (Ω) and 8Ω, but the actual load impedance varies with frequency. Power amplifiers must be able to supply the high peak currents and peak voltages required to drive these loudspeakers and operate efficiently with a dynamic range of voltage amplitude as part of audio input signal data. The "rail" voltage provided to the amplifier needs to deliver sufficient power to ensure that the highest amplitudes of an input signal can be amplified in the same proportion as the lower amplitudes without distortion. However, there is an efficiency penalty for providing excess rail voltage to the amplifier for a given input signal. Excess rail voltage causes inefficiency and rapidly discharges power from a power source, such as a battery. Alternatively, if insufficient rail voltage is provided to the amplifier, then distortion may occur in the amplified signal.

Therefore, there is a need for an audio device that solves the problems described above. There is also a need for an amplifier containing an audio device that has improved efficiency, while preventing signal distortion.

SUMMARY OF THE INVENTION

Embodiments enclosed herein include a method and portable audio delivery system that has an improved efficiency and extended operation between recharges or battery replacements. An audio device includes a switch mode power supply (SMPS) coupled to a battery, a signal delay element, an envelope detector, and a switching signal amplifier. The amplifier receives a delayed input signal through a signal delay element after a predetermined lag time has elapsed. The amplifier amplifies the delayed input signal to produce an output signal using a variable rail voltage provided by the SMPS. By using an envelope detector to control the SMPS using a power instruction signal based on a characteristic of the input signal, the SMPS may be instructed to change the variable rail voltage that is received by the amplifier. In this manner, the amplifier is more efficiently managed and thereby the duration of time that the device may be powered by the power source is extended before the power source (e.g., battery) needs to be recharged or replaced.

In one example, an audio device is disclosed. The audio device includes a signal delay element configured to receive an input signal that includes the audio signal data and produce a delayed input signal that includes the audio signal data after a predetermined lag time has elapsed. The audio device further includes a switching signal amplifier to produce an output signal having an output voltage based on the delayed input signal, a gain of the switching signal amplifier, and a received variable rail voltage. The audio device further includes an envelope detector to receive the input signal and produce a power instruction signal based on at least one characteristic of the input signal detected during the predetermined lag time. The audio device further includes power supply providing a battery voltage. The audio device further includes a switch mode power supply configured to provide the variable rail voltage based on the battery voltage and the power instruction signal received from the envelope detector. In this manner, the variable rail voltage provided to the amplifier may be adjusted to provide efficient operation. The envelope detector may also be configured to select one of at least two predetermined levels of output that is used to generate the variable rail voltage.

In another example a method for providing an output signal using an audio device is disclosed. The method includes delaying, with a signal delay element, a received input signal that includes audio signal data to produce a delayed input signal after a predetermined lag time has elapsed. The method also includes generating, with a switching signal amplifier, the output signal having an output voltage based on the delayed input signal, a gain of the switching signal amplifier, and a received variable rail voltage. The method also includes generating a power instruction signal, with an envelope detector, based on at least one characteristic of the received input signal during the predetermined lag time. The method also includes delivering, with a switch mode power supply, a variable rail voltage signal to the switching amplifier, wherein the variable rail voltage signal is derived from a voltage received from a battery and the power instruction signal. In this manner, the input signal may be amplified while avoiding clipping or other distortion.

In another example, an audio device is disclosed. The audio device includes a digital signal processing module having a signal delay element configured to receive an input signal that includes audio signal data and to produce a delayed input signal that include the audio signal data after a predetermined lag time has elapsed. The digital signal processing module further has an envelope detector configured to receive the input signal and to produce a power instruction signal based on at least one characteristic of the input signal detected during the predetermined lag time. The audio device also includes a switching signal amplifier to receive the delayed input signal and to produce an output signal having an output voltage based on a gain of the switching signal amplifier and a received variable rail voltage, wherein the switching signal amplifier comprises a class-D signal amplifier. The audio device includes a battery providing a battery voltage. The audio device also includes the switch mode power supply configured to provide the variable rail voltage based on the battery voltage and the power instruction signal received from the envelope detector. The audio system also may include an interface coupled to a speaker configured to receive the output signal from the switching signal amplifier, wherein the speaker is configured to convert the output signal to an audio signal. In this manner, energy efficient amplification of the input signal is provided.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
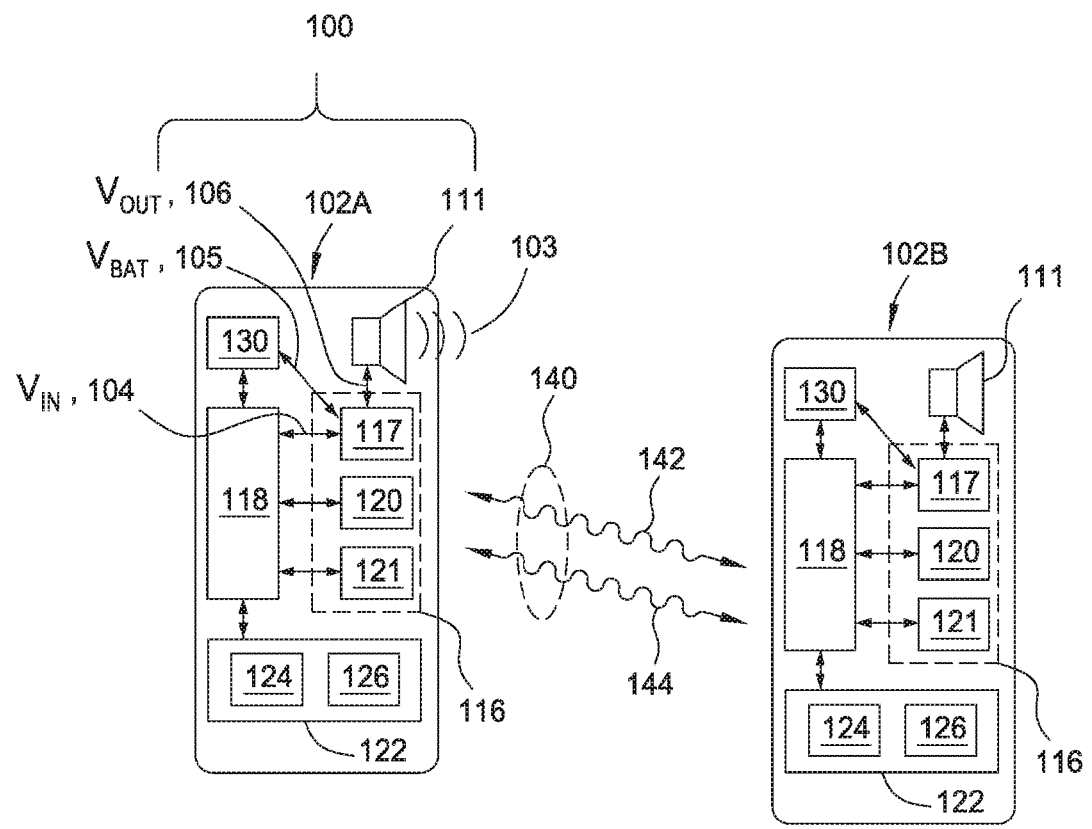
FIG. 1 is a schematic diagram illustrating an audio delivery system that includes one or more exemplary electronic devices, such a first electronic device and a second electronic device that are each configured to interact with each other according to one embodiment of the present disclosure.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments of the disclosure may include a method and apparatus for improving the efficiency and extending the operation time between recharges or battery replacements of a portable audio delivery system. Embodiments of the disclosure may provide an audio delivery system that includes a processor, an audio processing device, a speaker, and a rechargeable power source. The audio delivery system is generally configured to generate and/or receive an audio input signal and efficiently deliver an amplified, high quality audio output signal to a user. In some embodiments of the disclosure, the audio processing device of the audio delivery system may include a switch mode power supply (SMPS), a signal delay element, an envelope detector, and a signal amplifier.

The operation time between recharges of a typical portable audio device depends on the availability of energy delivered from a finite power source, such as batteries, that have a limited energy storage capacity. The efficient use of the useable energy of a battery enables an audio device to be operated as long as possible before the battery needs to be recharged or replaced. In general, there are two main non-exclusive approaches to prolonging the useable operational time of a battery-powered electronic device before recharging or replacing the battery: providing batteries that have larger energy storage capacities; and operating the electronic device more efficiently when being powered by the energy from the batteries. Providing larger batteries increases the device cost and typically affects its form factor, so there is a need for ways to improve the efficiency of a portable audio device.

Audio delivery devices typically perform multiple tasks to deliver an audio signal in the form of sound to the user, including receiving and/or generating an audio signal, storing the audio signal, retrieving the audio signal from storage, and converting the audio signal into a sound that the user can perceive and enjoy. In this regard, audio delivery devices support activities in the electrical and mechanical domains, wherein the output signal created by the audio device is received by a transducer (sometimes called "driver") of a speaker system which converts the output signal of the audio delivery device into sound to be received by the user. The load applied by the speaker system upon the audio device can be substantial when the amplitude of the outputted sound is large. The audio signal data received by the audio device as input is typically insufficient to support the amount of power (e.g., voltage and current) required by the speaker system to produce a desirable output to the user. The task of amplifying the input signal to produce a desirable output signal compatible with the speaker system is often an inefficient process, which can provide one of the biggest opportunities to improve the efficiency of an audio delivery device. By way of example, more energy may be dissipated in the amplification process in some audio delivery approaches than is consumed by the speaker system.

There are several power amplification techniques that are available for audio delivery systems. Power amplifiers are conveniently classified according to letters, for example, Class-A, B, AB, C, G, H and D. Amplifier classes A through C are referred to as linear amplifiers, and are distinguished by the percentage of time that a direct current (DC) bias current flows through a collector or drain of the output-stage transistors of the amplifier and as such must dissipate as heat some portion of the power provided by the power supply while they deliver the output voltage and current needed to operate the loudspeaker driver. Class-A/B is the most common linear amplifier and considered to be the best compromise between distortion and power consumption.

Class-A linear amplifiers include output-stage transistors which are directly connected to the speaker system and produce high fidelity amplification. These output-stage transistors may be, for example, bipolar junction (BJT) or metal oxide semiconductor (MOS) transistors. In order to provide the amplified output signal with high fidelity, the output-stage transistors of class-A amplifiers operate in the linear region where output voltage is proportional to input voltage and are provided with a large DC-bias to supply power. The DC-bias is linked with inefficiency and power loss as it results in non-zero drain-source current in at least one of the output-stage transistors even when no power is needed by the speaker system. In many cases, more power may be consumed by a class-A amplifier than is consumed by the speaker system. This large inefficiency makes class-A amplifiers impractical for portable devices where conserving energy to prolong the operation time of the amplifier between recharges of the power source is valued.

In contrast, Class-B amplifiers attempt to improve power efficiency by employing two output-stage transistors arranged in a push-pull manner to amplify respectively positive and negative portions of an input signal. The resulting amplified signals from the two output-stage transistors are combined to produce the output. Power efficiency is improved over the class-A amplifier by reducing the large DC-bias by switching off one or more of the output-stage transistors as part of the push-pull approach. However, the class-B amplifier approach has fidelity quality issues due to signal distortion occurring when switching between the two output-stage transistors. A hybrid Class-AB amplifier attempts to improve signal fidelity by adding additional DC-bias to the two output-stage amplifiers to reduce distortion when switching between output-stage transistors, however, the combination of lower efficiency and signal distortion is typically inadequate for portable devices with high fidelity amplification requirements.

Class-C amplifiers are another linear amplifier type, but not a practical choice for portable audio delivery devices. Although class-C amplifiers conduct less than half of the input signal to improve efficiency, the class-C amplifiers generally suffer from high distortion which is reduced by tank circuits incorporated into circuits having class-C amplifiers. These tank circuits are generally impractical for audio signal data frequency ranges (e.g., range of frequencies from 20 hertz to 20 kilohertz) used in audio signal processing, and so are instead used in signal devices for processing higher radio frequencies. Accordingly, at this time class-C amplifiers are generally considered to be incompatible with providing high quality, or even good, audio sound reproduction required by users of audio devices.

Class G amplifiers will improve the power efficiency of linear amplifiers by providing multiple stacked power supplies that the amplifier will jump between as the signal demands, thus reducing the power dissipation in the amplifier at low signal levels. Class H amplifiers will modulate the power supply feeding a linear amplifier. Class H are similar to Class G but using a continuously variable power supply rather than a limited number of voltage steps. Class-G amplifiers can be incrementally more efficient than Class H at the expense of significant power supply complexity often requiring the power supply to be of Switch-mode type whereas Class-H systems can use linear power supplies with multiple taps.

Class-D amplifiers are considered to have a high efficiency and perform amplification with low distortion. The class-D amplifiers are typically available in sizes that allow them to be used in portable electronic devices, unlike linear A/B and linear class-G and class-H type amplifiers. The class-D amplifiers are pulse width modulator (PWM) amplifiers including two output-stage transistors, for example MOSFETs, that are in a push-pull arrangement and switch between on and off modes to significantly improve power efficiency. In order facilitate the amplification of the signal, the class-D amplifier converts the input signal to a pulse width modulated (PWM) square wave signal fluctuating between maximum and minimum amplitudes. The output stage transistors in class-D amplifiers are designed to operate at a fully saturated operating point or are off, and minimize a relatively inefficient linear transition between these operating points. When in fully saturated mode the resistance of the output stage transistors is configured to be very low and thereby minimize energy loss from resistance heating. Also, output-stage transistors can be selected to effectively eliminate current flow when in the off mode to also minimize loss. Further, once the PWM signal is amplified, a low-pass filter (LPF) can be used to convert the amplified PWM signal to an analog output signal to be compatible with a speaker system. Thus, high fidelity amplification and reasonably efficient operation can be gained by use of a Class-D amplifier.

However, although class-D amplifiers offer higher efficiencies than some other linear amplifier types (e.g. class-A, B, AB, G, H, etc.) and is regarded by most engineers as the pinnacle of efficiency in audio amplifier systems, higher levels of customer satisfaction will occur if the operation of the electronic device is extended between recharges or replacements of the power source. Approaches discussed herein provide efficiency improvements to manage the root causes for inefficiencies in switching amplifiers, which are also sometimes referred to as digital amplifiers, pulse width modulation (PWM) amplifiers, pulse density modulation (PDM) amplifiers or other similar types of amplifiers. In one example, a switching amplifier is a class-D amplifier. A large portion of the inefficiencies found in class-D amplifier will occur due to "switching losses," which are generated when the class-D amplifier's output-stage MOSFETs transition between an "on" and "off" state when amplifying an audio input data signal. In fact, many Class-D amplifiers will be continuously switching the output stages at high frequencies even when there is no output signal being reconstructed at the speaker. In particular, the inefficiencies will be large when the audio input signal is small and very little power is being delivered through the reconstruction low pass filter (LPF) to the speaker. Additionally, Class-D amplifiers are more complex than linear amplifiers and therefor have a significant amount of circuitry needed to effectively convert the linear input signal into a PWM modulated output signal. These signal processing circuits consume power parasitically, and that power is proportional to the power supply voltage applied to the circuit. As illustrated in FIG. 5C, one can see that in a typical Class-D amplifier, the efficiency of the amplifier is poor when the output power level delivered to the speaker is small relative to the full-power capability of the circuit and the power supply voltage applied. In the example illustrated in FIG. 5C, three curves 581, 582 and 583 are plotted for three different full-power levels provided to a battery powered speaker assembly, such as a first power level (e.g., 6V), second power level (e.g., 12V) and third power level (e.g., 24V), respectively. The inefficiency in each of speaker assemblies at low operating power levels can be seen by the drop-off in each of these curves at the low output power levels. The inefficiency at low output power levels is generally due to the parasitic losses in the class-D amplifier signal processing circuits and the switching losses that are ever-present regardless of output power being delivered to the speaker driver. These inefficiencies are exasperated when one considers that most music listening is done at much lower power levels than the full power capability of a system, and that most musical content has crest factors (ratio of the peak signal to average signal of a typical time block of signal) of 4 or more. Thus, in some embodiments discussed herein to increase the efficiency of the audio device, a power supplied through the power amplification circuit of the class-D amplifier is automatically adjusted to a level that is just high enough to reliably produce a high quality sound by a speaker at that instant in time. The desired amount of power supply provided to the power amplification circuit of the class-D amplifier is often referred to herein as the variable rail voltage (VR). Also, in various embodiments, the power provided through the power amplification circuit of the Class-D amplifiers is delivered such that it is sufficiently high to support amplification of the high amplitude peaks of the input audio data signal to avoid distortion to the output signal by "clipping." Clipping occurs when the power supply provided by the output amplifier is insufficient to meet the power level required by input signal, thus not allowing the generated audio output to achieve its desired peak level. However, during time periods of the lower amplitude peaks, the variable rail voltage VR is provided to be only at the necessary levels required to amplify the lower amplitude peaks. The audio device and associated methods described herein reduce the variable rail voltage VR applied to a class-D amplifier during time periods of low amplitude within the input signal to provide in some cases, for example, a thirty-five (35) percent improved power efficiency.

FIG. 1 is a schematic diagram illustrating an audio delivery system 100, according to one embodiment of the present disclosure. In one example, the audio delivery system 100 may include an electronic device, such as electronic device 102A. In general, the electronic device 102A can be a computing device that can be used with other wireless or wired electronic devices. In one example, the electronic device 102A is able to communicate with a similarly configured electronic device 102B over a wireless communication links 140, such as communication links 142, 144.

During operation, when the electronic device 102A of the audio delivery system 100 is instructed to generate an audio signal 103 (e.g., acoustic signal), then an audio processing device 117 within the electronic device 102A receives electrical power 105 from a power source 130 and an input signal 104 from a processor 118. The audio processing device 117 of the electronic device 102A includes various features discussed below to amplify the input signal 104 and produce the output signal 106 to be received by a speaker system 111. The speaker system 111 receives the output signal 106 and converts the output signal 106 to the audio signal 103. In one embodiment, the input signal 104 may be produced by electronic signals received though the communication links 142, 144, such as a Bluetooth signal emitted from a media content storage device, such as an iPhone. In another embodiment, the input signal 104 may be produced by electronic signals stored within the electronic device 102A. In this case, the electronic signals may be stored as stored media data 126 in a memory unit 122 of the electronic device 102A. In this manner, the electronic device 102A may provide the audio signal 103.

In general, an electronic device 102, such as electronic device 102A or electronic device 102B as shown in FIG. 1, may be any technically feasible electronic device that is configured to communicate and/or interact with another electronic device. In general, the electronic device 102 can be any type of electronic device, such as a wireless speaker, PDA, cell phone (e.g., smart phone), a tablet computing device, laptop computer, an e-book reader, a portable music player, or other similar battery powered portable electronic device. Examples of the electronic devices 102 may include, but are not limited to a Logitech® X300 Mobile Wireless Stereo Speaker, Logitech® X100 Mobile Wireless Speaker, Logitech® portable speakerphone P710e, Logitech® Ultimate Ears Boom™, iPod®, iPhone®, iPad®, Android™ phone, Samsung phone, Samsung Galaxy®, Squeeze™ box, Microsoft Surface®, laptop or other similar device. In practice, an electronic device 102 may be battery-operated from a power source 130, although these devices may at one time or another receive power from a wired connection to a wall outlet, wireless charger or other similar devices without deviating from the basic scope of the disclosure provided herein. The power source 130 may be able to provide a DC voltage that depends on the chemistry and number of cells in the battery pack, such as between about 1.5 volts and about 24 volts. In one example, the power source 130 is able to provide a DC voltage that is between about 1.5 volts and about 12 volts. In another example, the power source 130 is able to provide a DC voltage that is between about 3 volts and about 12 volts. In general, an electronic device 102 may comprise a device that efficiently amplifies a high fidelity the input signal 104 to produce a high quality output signal 106. In this manner, the output signal 106 may be received and converted by the speaker system into the audio signal 103 that is enjoyed by a user.

The electronic device 102 may include electrical components that include a processor 118 coupled to input/output (I/O) devices 116, the power source 130, and a memory unit 122. Memory unit 122 may include one or more software applications 124. The memory unit 122 may also include stored media data 126 having the audio signal data. The processor 118 may be a hardware unit or combination of hardware units capable of executing software applications and processing data. In some configurations, the processor 118 includes a central processing unit (CPU), a digital signal processor (DSP), an application-specific integrated circuit (ASIC), and/or a combination of such units. The processor 118 is generally configured to execute the one or more software applications 124 and process the stored media data 126, which may be each included within the memory unit 122.

The I/O devices 116 are coupled to memory unit 122 and processor 118, and may include devices capable of receiving input and/or devices capable of providing output. The I/O devices 116 include the audio processing device 117 which receives the battery power 105 and an input signal 104, and produces the output signal 106 which may be received by the speaker system 111. The audio processing device 117 amplifies the input signal 104, having the audio signal data $V_{IN}$, to produce the output signal 106 having the output voltage $V_{OUT}$. The audio processing device 117 generally includes several features, discussed later, which efficiently produce a high fidelity amplification of the input signal 104 and thereby extend an operation time of the audio delivery system 100 before a recharge or replacement of the power source 130 is required to continue operation of the audio delivery system 100.

The I/O devices 116 also include one or more wireless transceivers 120 that are configured to establish one or more different types of wired or wireless communication links with other transceivers residing within other computing devices, such as a transceiver within the I/O devices 116 of another electronic device. A given transceiver within the I/O devices 116 could establish, for example, a Wi-Fi communication link, near field communication (NFC) link or a Bluetooth® communication link (e.g., BTLE, Bluetooth classic), among other types of communication links with similar components in the electronic component 102B.

The memory unit 122 may be any technically feasible type of hardware unit configured to store data. For example, the memory unit 122 could be a hard disk, a random access memory (RAM) module, a flash memory unit, or a combination of different hardware units configured to store data. The software application 124, which is stored within the memory unit 122, includes program code that may be executed by processor 118 in order to perform various functionalities associated with the electronic device 102.

The stored media data 126 may include any type of information that relates to a desired control parameter, user data, electronic device configuration data, device control rules or other useful information, which are discussed further below. The stored media data 126 may include information that is delivered to and/or received from another electronic device, such as the input signal 104. The stored media data 126 may reflect various data files, settings and/or parameters associated with the environment, device control rules and/or desired behavior of the electronic devices 102A, 102B.

Electronic Device Configuration Examples

Figure 2:
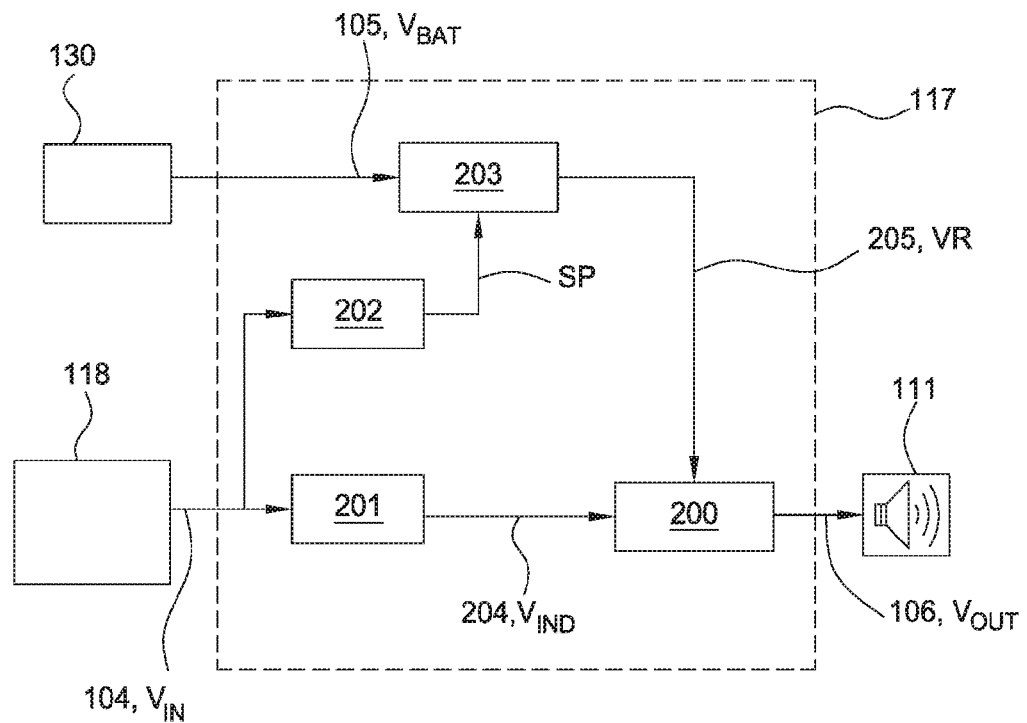
FIG. 2 illustrates a schematic view of a portion of the first electronic device, according to one embodiment of the present disclosure.
Figure 3:
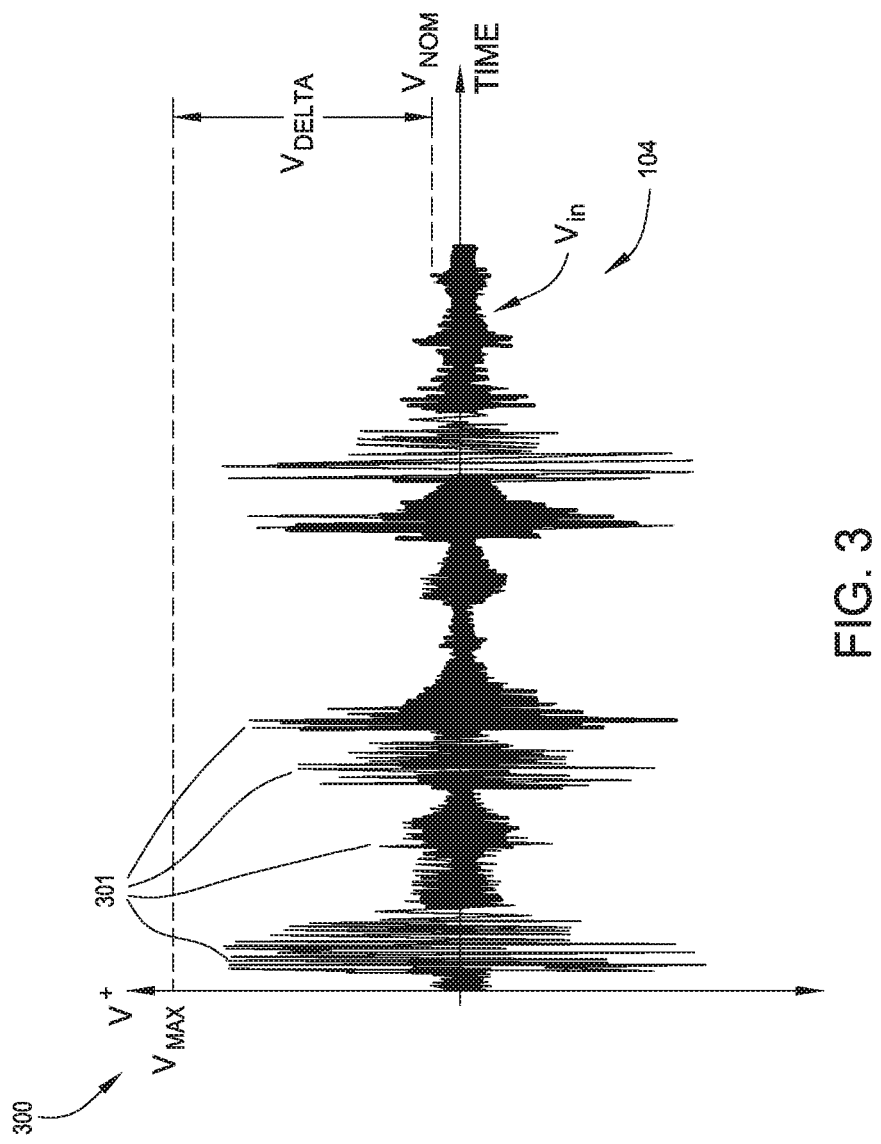
FIG. 3 is a graph depicting an exemplary input signal as a function of time.
Figures 4A, 4B:
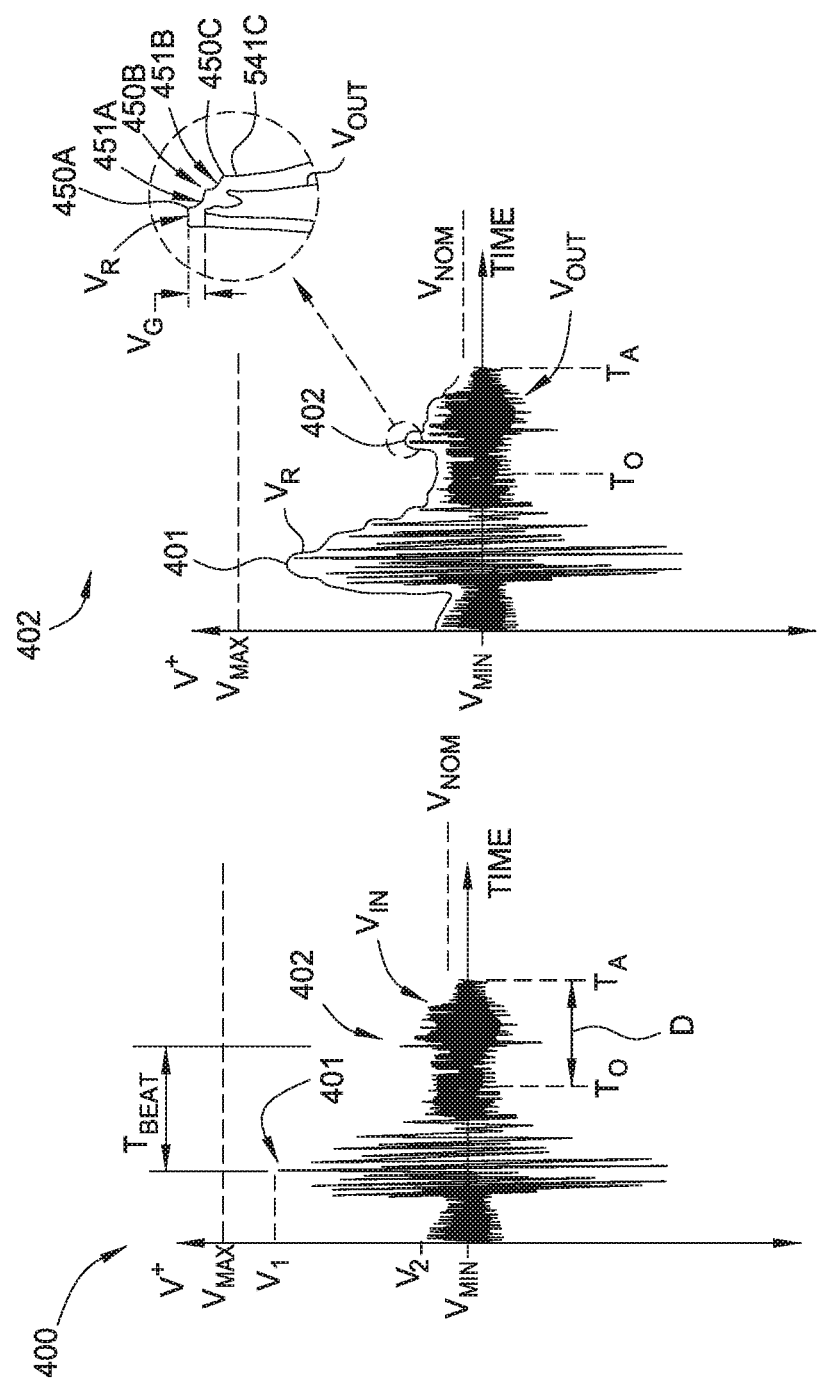
FIG. 4A is a graph illustrating a portion of the input signal depicted in FIG. 3 and characteristics of the input signal that may be analyzed, according to an embodiment of the disclosure provided herein.
FIG. 4B is a graph depicting a variable rail voltage superimposed on an output signal derived from the audio signal data illustrated in FIG. 4A, according to an embodiment of the disclosure provided herein.

FIG. 2 illustrates a schematic of an audio processing device 117, which is formed within the I/O devices 116. The audio processing device 117 generates the output signal 106 by amplifying the input signal 104 received from the processor 118 and using the battery power 105 from the power source 130. The processor 118 may be included in some embodiments as part of, for example, an audio system-on-chip (SoC) solution with dual mode Bluetooth connectivity. The audio processing device 117 includes a signal amplifier 200, a signal delay element 201, an envelope detector 202, and a switch mode power supply 203. In some embodiments, the envelope detector 202 may comprise a digital signal processor. In an effort to illustrate the operation of the audio processing device 117, various input signals that are received by the audio processing device 117 and output signals that are generated by the audio processing device 117 are discussed below in conjunction with FIGS. 3, 4A and 4B. FIG. 3 depicts a graph 300 depicting an exemplary input signal 104 as a function of time. FIG. 4A is a graph 400 of a portion of the input signal of FIG. 3 depicting exemplary characteristics of the input signal 104 in relation to a predetermined lag time D. FIG. 4B is a graph depicting the variable rail voltage VR superimposed proportionally on the output signal 106 (e.g., audio signal data $V_{OUT}$). While the signal amplitudes illustrated in FIGS. 4A and 4B are similar, one will appreciate that the input and output voltages (Y-axis) shown in FIGS. 4A and 4B, respectively, are typically not the same, since the input signal level is generally less than the output signal level due to the gain provided to the output signal by the signal amplifier 200.

In some embodiments, during operation, the audio processing device 117 receives an input signal that includes audio signal data and the audio processing device 117 delivers an output signal having an output voltage amplified relative to the input signal based on the gain of the signal amplifier 200 of the audio processing device 117. Desirably, the output signal is a precise amplified representation of the input signal which has been efficiently produced by the audio processing device 117 using electrical power from the power source 130. The signal amplifier 200 of the audio device produces the output signal using the input signal and a variable rail voltage VR provided by the power supply 203, or also referred to herein as the switch mode power supply (SMPS) 203. In some embodiments, the signal amplifier 200, or also referred to herein as the power amplifier, is a switching-type amplifier or switching amplifier. In general, the signal amplifier 200 operates most efficiently when the variable rail voltage VR is just high enough to support the high fidelity amplification of the input signal. As noted above, excess levels of the variable rail voltage cause inefficiencies, and thus power loss in the form of heat at the signal amplifier 200. By use of the signal delay element 201 in combination with the envelope detector 202, an input signal may be delayed until a predetermined lag time has elapsed. This delay enables the audio signal data to be analyzed by the envelope detector 202 in order to determine at least one characteristic of the input signal before the portion of the delayed input signal reaches the signal amplifier 200. In this manner, the envelope detector 202 may provide a power instruction signal to the SMPS 203 based on the at least one characteristic of the input signal. Upon receiving the power instruction signal, the SMPS 203 provides the variable rail voltage VR to the signal amplifier 200 that is consistent with the efficient and high-fidelity operation of the signal amplifier 200. It is noted that the gain of the signal amplifier 200 should be agnostic to changes in the variable rail voltage VR as provided by the SMPS 203. This agnostic attribute is referred to as "power supply rejection" and is common in "feedback error correction" style amplifiers.

In order to provide sufficient time to analyze the input signal 104, so that an appropriate variable rail voltage VR can be determined and provided to the signal amplifier 200, the signal delay element 201 receives the input signal 104 and produces the delayed input signal 204D including the delayed audio signal data $V_{IND}$). The signal delay element 201 may comprise, for example, a digitally-controlled delay element (DCDE) that can provide the delayed audio signal data after a predetermined lag time that is greater than zero seconds, such as in a range from one (1) microsecond (μs) to three-hundred (300) milliseconds (ms). The length of the delay may be designed to be long enough to allow the SMPS 203 sufficient time to adjust to different voltage levels as instructed by the envelope detector 202. Alternatively, the length of the delay may be determined to provide a sufficient time window for a block of data to be received from the input signal as part of a "look ahead" analysis that may be utilized to determine characteristics of the input signal which may be useful to optimize the variable rail voltage VR. The predetermined lag time D (FIG. 4A) enables the input signal 104 to be analyzed so that a tracking signal 205, which has a variable rail voltage VR, can be determined and created prior to amplification by the signal amplifier 200. The tracking signal 205 is precisely adjusted by the SMPS 203, based on a power instruction signal SP received from the envelope detector 202, to provide efficient operation of the signal amplifier 200. After receiving the delayed input signal 204 from the signal delay element 201, the signal amplifier 200 amplifies the delayed input signal 204 using a set amplifier gain to produce the output signal 106. The signal amplifier 200 may comprise, for example, a class-D signal amplifier providing opportunities to reduce power consumption during time periods of lower peak amplitudes of the input audio signal data by adjusting the variable rail voltage VR.

In some configurations, a lower and upper limit may be established for VR based the lower and upper limits required by the amplifier 200. An example may be an amplifier that cannot operate below 4 volts or it shuts down, or above 24 volts or it is damaged.

It is noted that the audio processing device 117 depicted in FIG. 2 may be easily modified in other embodiments to accommodate multiple signal channels (e.g. right and left channels). In these other embodiments, the SMPS 203 may provide variable rail voltages VR respectively to multiple signal amplifiers (not shown) which are dedicated to right and left channels derived from the input signal 104. These variable rail voltages may be optimized independently for the right and left channels. In this manner, additional efficiency may be achieved in some cases. In some embodiments of the audio delivery system 100 there may be additional channels than merely the right and left channels. One example of an additional channel is a subwoofer channel. Additional channels may be associated with respective rail voltages which may be optimized to provide higher efficiencies.

As noted above, FIG. 3 depicts a time graph 300 depicting an exemplary input signal 104 as a function of time. The audio signal data $V_{IN}$ of the input signal 104 may include a plurality of amplitudes, including peaks 301. The varying amplitude of the input signal 104 (FIG. 4A) may be amplified to generate an output signal 106 (FIG. 4B) having an output voltage $V_{OUT}$ proportional to the audio signal data $V_{IN}$ of the input signal 104. Accordingly, consistent with FIG. 4B, the variable rail voltage VR can to be modulated commensurate with changes in the voltage amplitude of the audio input data $V_{IN}$ to achieve higher efficiencies. Accordingly, energy from the power source 130 (FIG. 1) would be consumed at a reduced rate to extend the operation time of the audio delivery system 100 before the power source 130 would have to be recharged, replaced, or supplemented by an alternative power source (not shown, for example a wall socket).

With continued reference to FIG. 3, the audio processing device 117 may be limited to amplifying the peaks 301 of the audio signal data $V_{IN}$ up to a maximum voltage $V_{MAX}$. The maximum voltage $V_{MAX}$ may or may not be based on the volume limits of the speaker system 111 or electronic limits of the components of the audio processing device 117. The audio processing device 117 may provide high fidelity amplification as long as the peaks 301 of the audio signal data $V_{IN}$ do not exceed the maximum threshold $V_{MAX}$, otherwise the amplitude of the peaks 301 in excess of the maximum voltage $V_{MAX}$ may be cutoff and thus be heard as distortions in the audio output received by the user due to the replacement of the desired speaker output with the maximum voltage $V_{MAX}$. Conventional audio devices generally use a single constant variable rail voltage VR setting, which is set to the maximum voltage $V_{MAX}$ level, to deliver an audio output signal 106. However, as noted above, a constant variable rail voltage VR setting can undesirably reduce the time of operation of the audio delivery system 100 until a recharge or replacement of the powers source 130 is required, due to the inefficiencies generated in the power amplification circuit during the transitions between the "on" and "off" states of output-stage transistors when using a switching amplifier and parasitic power consumption of the signal processing elements, such as a class-D amplifier.

The audio processing device 117 may also include a capability of detecting a nominal voltage $V_{NOM}$, based on a characterization of the audio signal data $V_{IN}$. The audio processing device 117 may also be configured to determine if at least one characteristic of the audio signal data $V_{IN}$ is within a range $V_{DELTA}$ between the maximum voltage $V_{MAX}$ and the nominal voltage $V_{NOM}$.

As noted above, FIG. 4A is a graph 400 of a portion of the input signal of FIG. 3 depicting exemplary characteristics of the input signal 104 in relation to a predetermined lag time D. As depicted in FIG. 4A, the audio signal data $V_{IN}$ includes peaks 401, 402 separated by the time $T_{BEAT}$, which may be the beat or tempo of the audio signal data $V_{IN}$. The predetermined lag time D may be selected to be less than the time $T_{BEAT}$ in order to simplify an analysis of the audio signal data $V_{IN}$ to amplitudes likely associated with a single large or high amplitude peak. The audio processing device 117 determines whether amplitudes V1, V2 of the peaks 401, 402 of the audio signal data $V_{IN}$ are disposed between the nominal voltage $V_{NOM}$ and the maximum voltage $V_{MAX}$, and then adjusts the variable rail voltage VR to improve efficiency of the signal amplifier 200. When the amplitude of the audio signal data $V_{IN}$ is less than a value associated with the nominal voltage $V_{NOM}$, then the variable rail voltage VR may be set to a value consistent with $V_{NOM}$. The constant value of $V_{NOM}$ may be set to reduce changes to the variable rail voltage VR related to noise and/or may be the minimum value of the variable rail voltage VR to enable the signal amplifier 200 to operate.

As noted above, FIG. 4B is a graph depicting the variable rail voltage VR superimposed proportionally relative to the output signal 106 (e.g., audio signal data $V_{OUT}$). To minimize the potential for spurious noise to be introduced into the system due to large swings in VR, a ramp up and down algorithm may be used. A ramp and decay of VR will reduce the system efficiency since they will not allow VR to precisely track $V_{OUT}$. The specific engineering implementation of the circuit will determine the trade-off of system transient noise, ramp values, and efficiency. In one example, the slow-decay algorithm may include an exponential decay algorithm. However, other slow-decay algorithms may also be used, for example, linear, logarithmic, and/or quadratic algorithms. The variable rail voltage VR generally follows the characteristics of the audio signal data $V_{IN}$ and exceeds the required voltage level to deliver a desired audio signal data $V_{OUT}$ by a buffer level $V_G$. The buffer level $V_G$ helps ensure that the signal amplifier 200 has an adequate level of variable rail voltage VR to avoid fidelity issues associated with clipping the peaks 401, 402, but also does not unnecessarily consume a large amount of power due to the inefficiencies created in the signal amplifier 200 by providing too high a variable rail voltage VR. In some configurations, the delay time is determined by the reaction time of the SMPS 203. For example, if it takes the SMPS 20 ms to change from the lowest VR to the highest VR, then our delay must be at least 20 ms to allow time for the SMPS to provide the VR voltage required to not clip the output signal.

In the close-up of FIG. 4B the set-points 450A, 450B, 450C of the variable rail voltage VR are respectively followed by decays 451A, 451B, 451C. In this manner, excess amounts of the variable rail voltage VR may be reduced after a peak value related variable rail voltage VR set-point have been delivered by the signal amplifier 200 to improve its efficiency when delivering the smaller amount of power required to produce the output signal 106 after the peak value was reached.

In some configurations, the audio delivery device 100 may include an audio processing device 117 that is adapted to provide different (or "asymmetric") rates of increase and decrease of the variable rail voltage VR between different variable rail voltage set-points (e.g., 450A, 450B, 450C in FIG. 4B) to improve efficiency of the amplification of the input signal yet reduce audible distortions in the audio signal 103 as perceived by the user. For example, the envelope detector 202 may instruct the switch mode power supply 203 to rapidly increase (in an approach called "fast attack") the variable rail voltage when a maximum amplitude of a portion of an input signal, as detected during the predetermined lag time, is determined to require a variable rail voltage VR level that is greater than what was previously being provided by the SMPS 203. If the increase in variable rail voltage VR is too slow, insufficient amplification may occur because the variable rail voltage VR setting may not be high enough to prevent clipping or other distortions of the output signal. In contrast, the variable rail voltage VR may be more slowly decreased from a variable rail voltage VR set-point in situations when the maximum amplitude of an amplified input signal is determined to be significantly lower than the set variable rail voltage VR level (e.g., amplified input signal <(VR−$V_G$)). In this case, use of the previous set variable rail voltage VR level would inefficiently deliver an output signal based on the current maximum amplitude of the input signal. In other words, the inefficient amplification may occur when the variable rail voltage VR is calculated to exceed an amount associated with a maximum amplified amplitude of the output signal $V_{out}$ plus the buffer level $V_G$. As noted above, in one example, the slow decrease in the variable rail voltage VR is shown as the decays 451A, 451B, 451C in FIG. 4B. The exponential decay of the variable rail voltage may be determined to decrease at a slower rate than the rate that the variable rail voltage VR increases to achieve a level that will assure that the input signal is desirably amplified. Therefore, the audio delivery device 100 can ensure that when amplifying dynamic and difficult to predict input signals that unwanted distortion can be prevented.

Figure 5A:
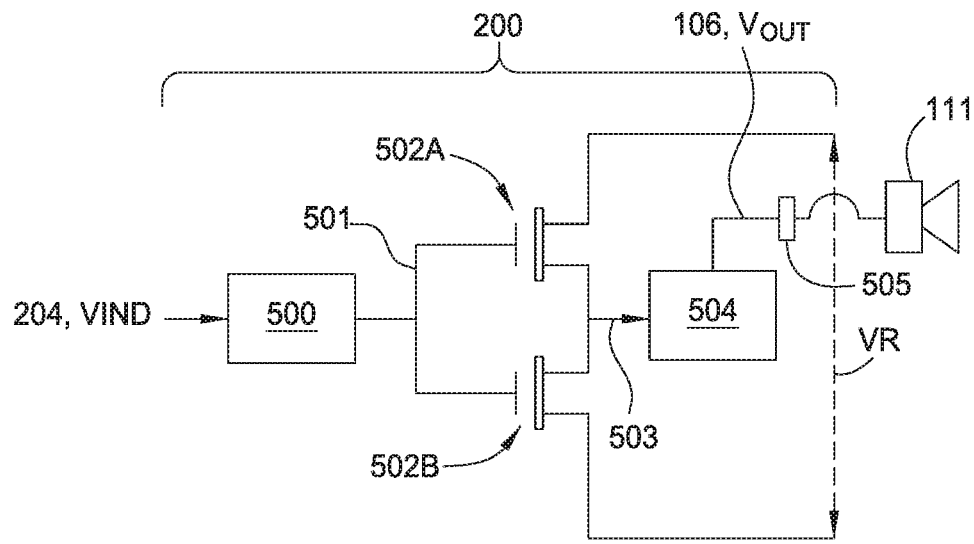
FIG. 5A is a schematic view of the signal amplifier that includes various components used to amplify a received input signal, according to an embodiment of the disclosure provided herein.

FIG. 5A is a schematic view of a portion of the signal amplifier 200 that includes various components used to amplify the delayed input signal 204 received from the signal delay element 201. As noted above, in some embodiments, the signal amplifier 200 may be a class-D signal amplifier. The signal amplifier 200 may include a pulse width modulator (PWM) controller 500, two metal-oxide semiconductor field effect transistors (MOSFETs) 502A, 502B, a low-pass filter 504, and an optional interface 505 for coupling to a speaker system 111. The PWM controller 500 converts the delayed input signal 204 into a pulse width modulated (PWM) signal 501 by comparing the delayed input signal 204 to a high frequency sawtooth or triangle waveform produced by a signal generator (not shown) of the PWM element 500. In some configurations, the signal amplifier 200 is a feedback type amplifier that uses a signal detected at a node within the circuit used to deliver the pre-filtered output signal 503 or a circuit within the low pass filter 504 to control the output of the PWM controller 500. The PWM signal 501 from the PWM controller 500 is transferred as inputs to electronic gates of MOSFETs 502A, 502B which receive the PWM signal 501 and are thereby driven by the PWM controller 500. The sources and drains of the MOSFETs 502A, 502B are coupled in series and are collectively supplied with the variable rail voltage VR from the SMPS 203 (FIG. 2) to create a pre-filtered output signal 503. In this manner, the pre-filtered output signal 503 is an amplified version of the PWM signal 501. The PMW signal 501 switches the MOSFETs 502A, 502B between on and off modes to facilitate the amplification of the PWM signal 501 and producing a pre-filtered output signal 503. Then, a low pass filter 504 within the signal amplifier 200 may be used to filter out the PWM carrier frequency from the pre-filtered output signal 503 and thereby provide the output signal 106 at the output voltage $V_{OUT}$ to the interface 505, which is coupled to the speaker system 111. In this manner, the delayed input signal 204 may be amplified efficiently with high fidelity according to the variable rail voltage VR which has been optimized based on a "look ahead" analysis of the input signal 104 which is facilitated by delaying the input signal 104 by the predetermined lag time D. In some configurations, the signal amplifier 200 may include a bridged pair of amplifiers that each feed one side of the speaker driver, and in this case each receive an input ($V_{IND}$) that is the inverse of the others input.

In some configurations, changes in the variable rail voltage VR of the signal amplifier 200 can impact the performance of the amplifier 200, and thus the magnitude of the variable rail voltage VR needs to be considered, so that the received input signal can be desirably amplified. In cases where the amplifier 200 comprises a D-type amplifier, the gain of the amplifier 200 is affected by changes in the variable rail voltage VR supplied to the amplifier 200. This is because the process of generating the pulse width modulation (PWM) signal that is delivered to an output filter, which is disposed within the D-type amplifier, is affected by the changing of the variable rail voltage VR. As a result, the changes to the variable rail voltage VR may be compensated for by using a closed loop feedback of the variable rail voltage VR supplied by the SMPS 203, so that the voltage $V_{OUT}$ of the output signal 106 is linearly proportional to a fixed gain applied to the associated delayed audio signal data $V_{IND}$). In this manner, the gain of the amplifier 200 may be protected against changes in the variable rail voltage VR.

As to efficiency, the efficiency of the signal amplifier 200 during operation largely depends on the power lost by the MOSFETs 502A, 502b, which are powered by the variable rail voltage VR. As discussed above, the MOSFETs 502A, 502B switch between "on" and "off" modes to facilitate the amplification process. As the MOSFETs 502A, 502B transition between "on" and "off" modes, the MOSFETs 502A, 502B respectively alternative between cutoff and saturated conditions. While in the cutoff condition, the resistances between the drains and the sources of the MOSFETs 502A, 502B are extremely high, for example several megaohms, and accordingly are effectively disconnected and prevent appreciable current from passing through the MOSFETs 502A, 502B. While in the saturated condition, the resistances between the drains and the sources of the MOSFETs 502A, 502B are extremely low, for example a few milliohms, and effectively create an electrical short.

Consistent with this operation, inefficiency in the form of resistance heating and power loss occur in the MOSFETs 502A, 502B due to two main causes. The first cause is resistance heating generated between the drain and source of the MOSFETs 502A, 502B, when the MOSFETs 502A, 502B are respectively turned on and are in a saturated condition. Selecting MOSFETs 502A, 502B having low resistance characteristics when in the saturated region of operation can reduce this first cause of inefficiency. The second cause of inefficiency is related to the power lost as the MOSFETs 502A, 502B transition between the "off" and "on" modes. It is believed that during the rise time and fall time between the "off" and "on" modes the MOSFETs are in a linear region of operation, where they have an electrical resistance that then wastes power as heat. The rise and fall time is shorter when the voltage spread the MOSFETs have to traverse is smaller. Thus, when the rise and fall time is shorter, then there is less time spent in this inefficient linear state, and the amount of inefficiency is reduced, as provided by one or more of the embodiments of the disclosure provided herein.

Figure 5B:
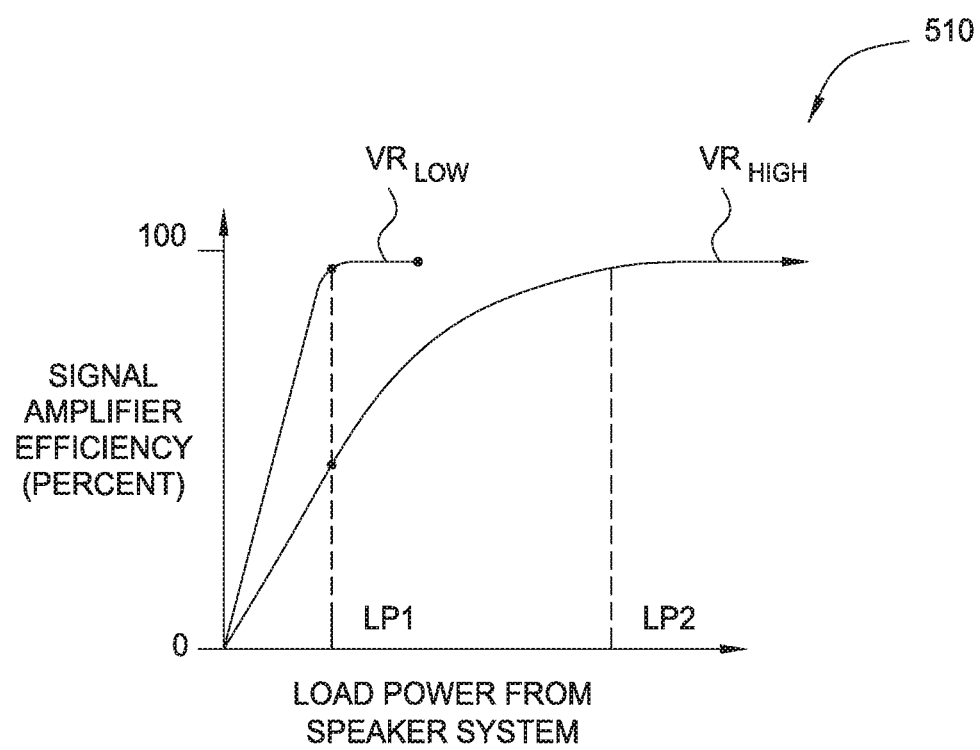
FIG. 5B is a graph of efficiency of the signal amplifier as a function of load power for an exemplary high rail voltage and an exemplary low rail voltage, according to one embodiment of the present disclosure.

FIG. 5B is a graph 510 of efficiency of the switching signal amplifier 200 of FIG. 5A as a function of load power of the speaker system 111. The graph includes one curve illustrating an exemplary higher value of the variable rail voltage VR_HIGH and a second curve for an exemplary lower value of the variable rail voltage VR_LOW. Exemplary values of the loads LP1, LP2 are also depicted to help illustrate the efficiency and power savings benefits of changing the variable rail voltage between multiple discrete variable rail voltage VR levels, as will be further discussed below. In the case of the load LP1. the efficiency benefits of changing the variable rail voltage VR to either one of the variable rail voltages VR_LOW or VR_HIGH signals, which is provided to the switching signal amplifier 200, is illustrated. However, as shown, the signal amplifier 200 can support exemplary load LP1 more efficiently when using the variable rail voltage VR_LOW as opposed to the variable rail voltage VR_HIGH. As depicted in the graph of FIG. 5B, the differences in efficiencies may be close to 50 percent when the VR_HIGH level of the variable rail voltage VR is used and almost 100 percent when the variable rail voltage VR_LOW (e.g., VR equals $V_{OUT}$ plus $V_G$) is applied. This efficiency loss is represented by the losses at the MOSFETs 502A, 502B as discussed above. In contrast, when an exemplary load LP2, which is higher than load LP1, is needed by the speaker system 111, then the variable rail voltage VR_LOW provided to the signal amplifier 200 may be insufficient to enable the amplification of the input signal (e.g., audio signal 103), and thus "clip" the output signal 106. The higher load LP2 may be associated with higher amplitudes appearing in the input signal that need to be amplified. In the higher load LP2 situation, the envelope detector 203 may instruct the switch mode power supply 203 to provide the variable rail voltage VR_HIGH to facilitate sufficient amplification of the input signal. In this manner, there is a benefit to increasing the variable rail voltage in order to facilitate sufficient amplification in situations of higher loads from the speaker system 111 requiring power, yet there is also an efficiency benefit to decreasing the variable rail voltage VR in situations of lower loads from the speaker system 111 as represented by the load LP1.

The determination of the variable rail voltage VR to provide efficient operation of the signal amplifier 200 is accomplished with the envelope detector 202. In general, the envelope detector 202 is configured to receive an input signal 104 and output a power instruction signal SP, which is received by the SMPS 203. In some embodiments, the envelope detector 202 is configured to provide the power instruction signal SP that includes a fixed set of multiple discrete signal levels, such that the generated variable rail voltage VR provided by the SMPS 203 includes a set of corresponding discrete variable rail voltage VR levels that are formed between the minimum and maximum output of the amplifier (e.g., $V_{DELTA}$ in FIG. 3). The discrete variable rail voltage VR levels may be formed by equally dividing up the range between the minimum and maximum output of the amplifier. In one example, the envelope detector 202 is configured to select one of at least two predetermined levels of output, which is used to generate a corresponding variable rail voltage VR level that is between the minimum and maximum output of the amplifier. In another example, the envelope detector 202 is configured to select one of at least three or more predetermined levels of output, such as sixteen (16) or thirty-two (32) predetermined levels of output, which is used to generate a corresponding variable rail voltage VR level that is between the minimum and maximum output of the amplifier.

Figure 6:
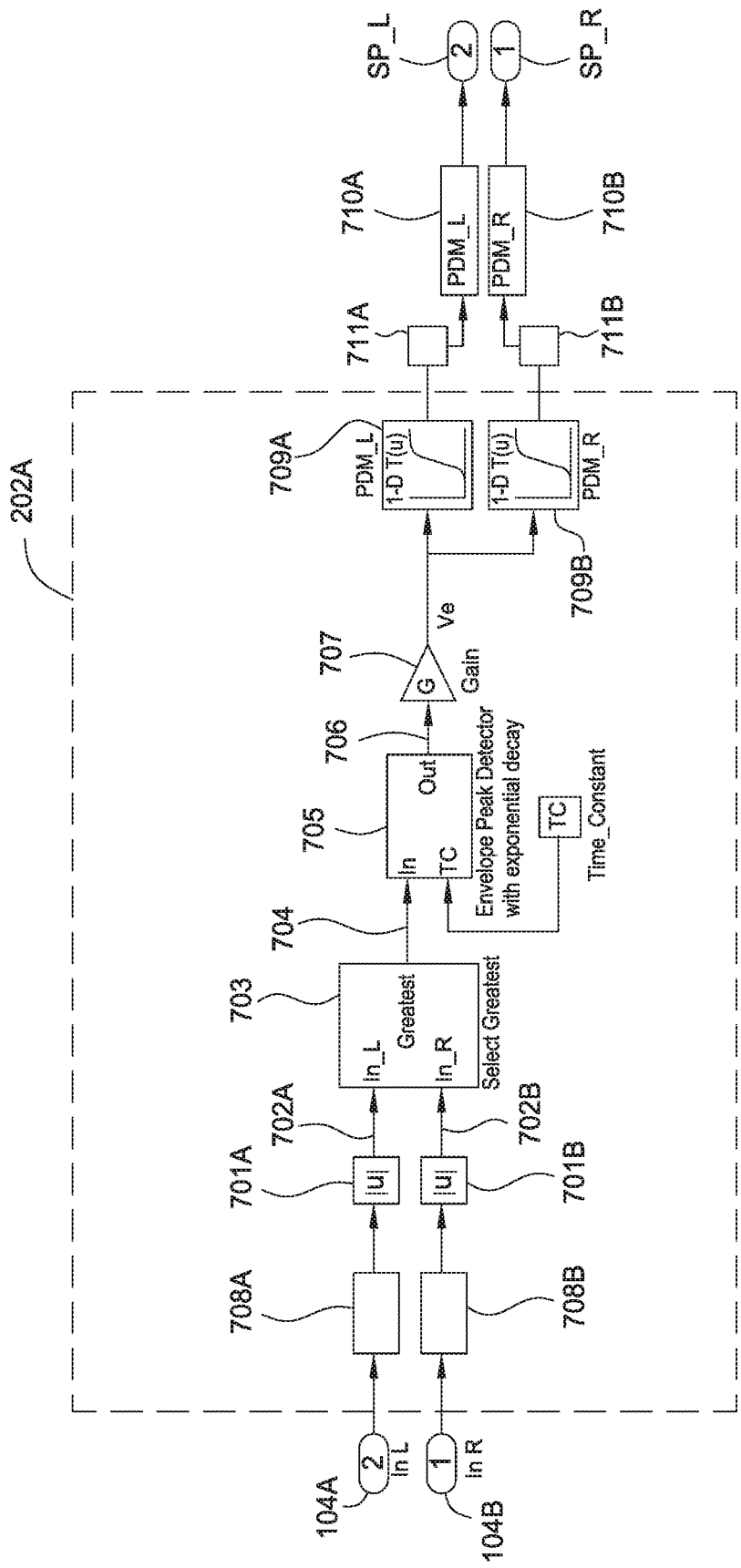
FIG. 6 is a schematic block diagram of another embodiment of the envelope detector of FIG. 2 with two channels, according to an embodiment of the disclosure provided herein.

FIG. 6 is a schematic block diagram of envelope detector 202A which is another embodiment of the envelope detector 202 of FIG. 2 with two channels. The envelope detector 202A receives the input signal 104 including right and left channels 104A, 104B and outputs a power instruction signal SP including right and left channels SP_R, SPL respectively to be received by the SMPS 203. In this regard, the envelope detector 202A may receive two channels 104A, 104B of the input signal 104 from the processor 118 at analog to digital converters 708A, 708B to produce digital signal representations of the two channels 104A, 104B. The digital representations may be received at absolute value elements 701A, 701B to produce absolute value signals 702A, 702B. The operations depicted in FIG. 6 downstream of the absolute value elements 701A, 701B may be parallel or may converge and be sequential depending on a complexity (e.g. cost) and efficiency tradeoff where the parallel path may be more expensive and complex, but may generate higher efficiency in some cases, because the right and left channels are independently optimized for the variable rail voltage. In the embodiment depicted in FIG. 6, the envelope detector 202A may include a peak detector 703, which determines a largest peak value 704 from the received absolute value signals 702A, 702B (e.g., left and right channel signals) during the predetermined lag time D and outputs the largest peak value 704 to a decay calculation unit 705. The delay calculation unit 705 applies an exponential decay to the largest peak value 704 at a desired time to produce a decayed peak value 706, which is proportional to the largest peak value 704. The decayed peak value 706 is multiplied by a gain G at gain amplifier 707, so the decayed peak value 706 is scaled in relation to the amplifier gain so that a peak value is associated with the maximum voltage $V_{MAX}$ (see FIG. 4B). Then, the resulting signal Ve is used as an index for look-up tables 709A, 709B holding the PDM (pulse density modulation) bit patterns (e.g., 16 bit) for the right and left channels. The PDM patterns in the look-up tables 709A, 709B may comprise, for example, thirty-two (32) entries that are each 16 bits wide. The thirty-two (32) entries may be associated with thirty-two (32) levels of the rail voltage VR which the envelope detector 202A may utilize to instruct the SMPS 203 to generate using the power instruction signal SP.

In other embodiments, more or less entries may be used according to the complexity and efficiency requirements of the audio delivery system 100, but at least two entries are expected. The PDM patterns may be selected to partially randomize the sequence or selections of the bits utilized in the PDM patterns. This partial randomization of the bits may minimize distortions from occurring during communication of the PDM patterns which may occur, for example, when consecutive bit types are repeated. In one example, the partial randomization may be incorporated by accessing multiple PDM patterns which may be alternatively be selected to better randomize the PDM patterns associated with the resulting signal Ve to minimize distortions associated with consecutive bit types. Further, once created, the PDM patterns are directed to output ports 710A, 710B of the envelope detector 202A by way through RC filters 711A, 711B to create an average signal based upon the number of bits occurring in the PDM pattern for the cycle. The larger the number of bits in a cycle, then a higher value of the average signal is created. The highest average signal occurs when thirty-two (32) bits are incorporated. The output ports 710A, 710B are coupled to the SMPS 203 to modulate the variable rail voltage VR (FIG. 2) using the instruction signals SP_L, SP_R depicted collectively in FIG. 2 as instruction signal SP. In this manner, the SMPS 203 may be instructed to provide the variable rail voltage VR for efficient operation of the signal amplifier 200.

Figure 7:
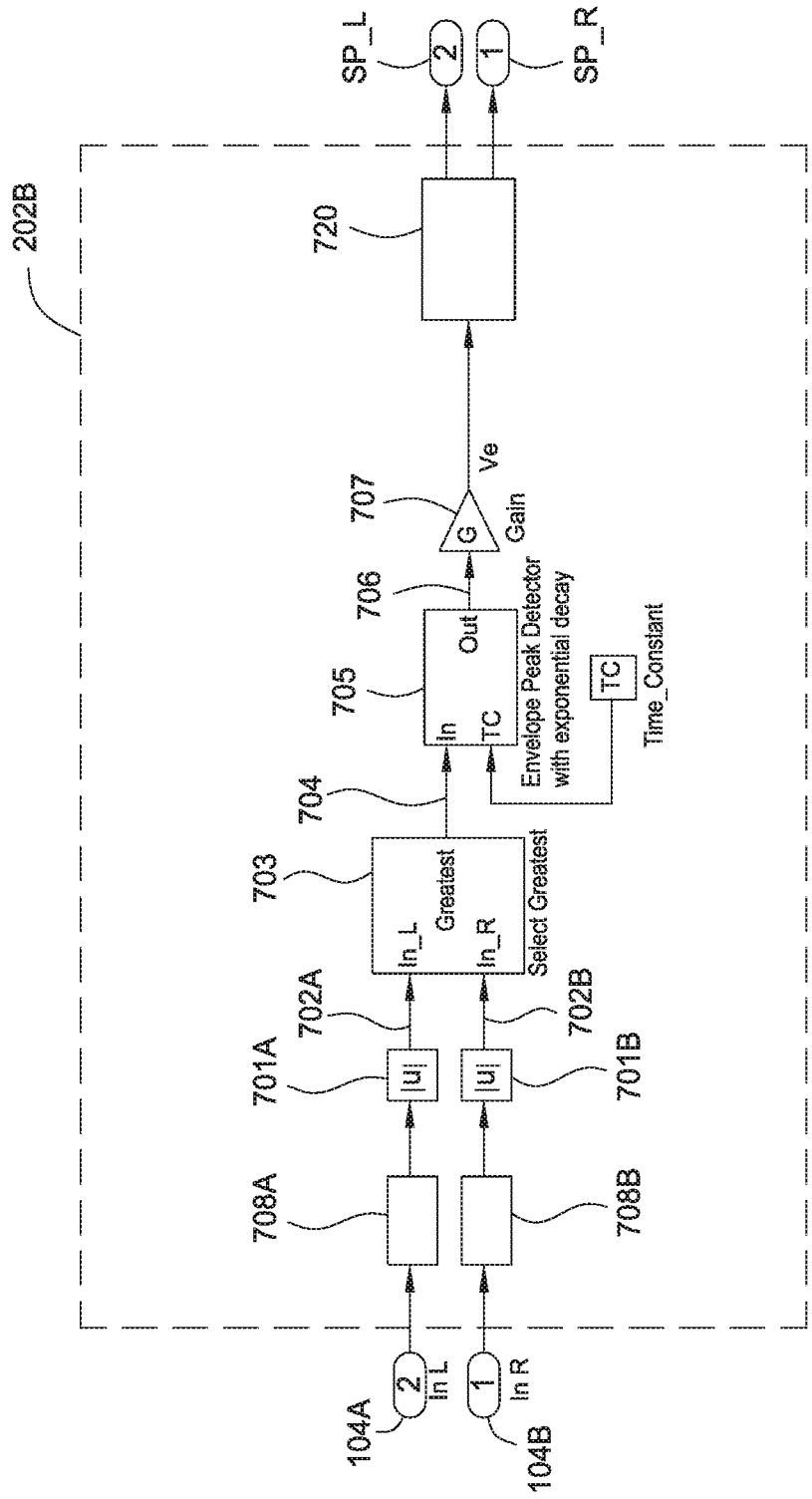
FIG. 7 is a schematic block diagram of yet another embodiment of the envelope detector of FIG. 2 with two channels, according to an embodiment of the disclosure provided herein.

FIG. 7 is a schematic block diagram of envelope detector 202B which is yet another embodiment of the envelope detector 202 of FIG. 2. The envelope detector 202B is similar to the envelope detector 202A of FIG. 6, and so the main differences will be discussed in the interest of clarity and conciseness. In this regard, the resulting signal Ve which is output from the gain amplifier 707 of the envelope detector 202B is received a digital to analog converter 720. The digital to analog converter 720 is coupled to the SMPS 203 to modulate the variable rail voltage VR (FIG. 2) using the instruction signals SP_L, SP_R depicted collectively in FIG. 2 as the power instruction signal SP. The advantage of the digital to analog converter 720 approach in FIG. 7 over the approach depicted in FIG. 6 is that the envelope detector 202B shown in FIG. 7 does not require the added complexity of the PDM look-up tables 709A, 709B or of the RC filters 711A, 711B for determining an average signal when generating the power instruction signals SP_L, SP_R that is sent to the SMPS 203. In this manner, the power instruction signal SP may be more efficiently generated to control the SMPS 203. In some embodiments, power instruction signals may be formed and/or controlled by techniques other than the PDM techniques discussed above. In some configurations, the power instruction signals may be formed and/or controlled by use of a DAC or other hardware configuration that uses an amplitude modulation (AM) processing technique.

Figure 8:
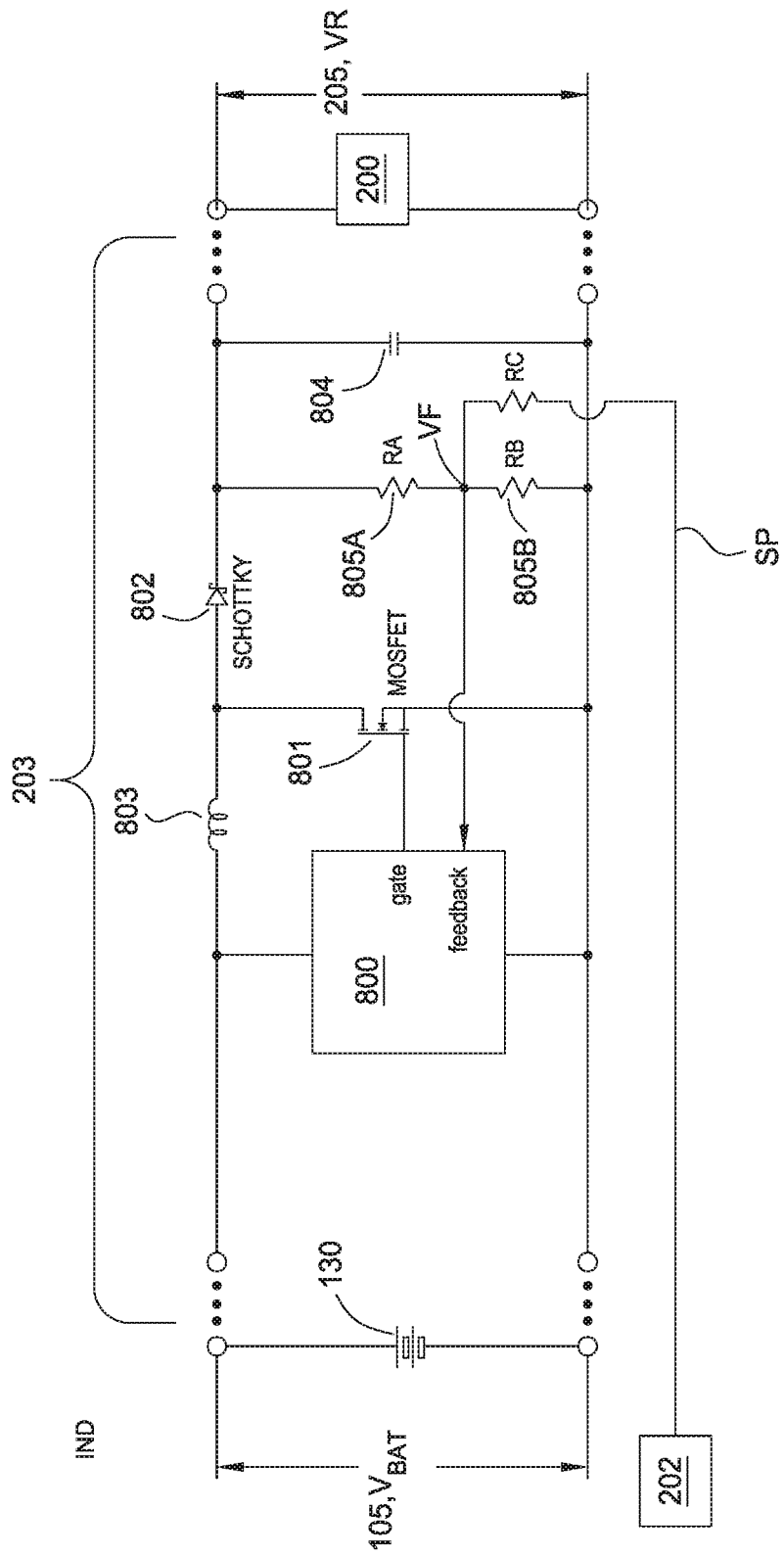
FIG. 8 is schematic representation of an exemplary embodiment of a switch mode power supply (SMPS), according to an embodiment of the disclosure provided herein.

FIG. 8 is schematic representation of an exemplary embodiment of the switch mode power supply (SMPS) 203 of FIG. 2. In one embodiment the SMPS 203 is a DC-to-DC power converter generating the variable rail voltage VR greater than the battery voltage $V_{BAT}$ from the power supply 130 (FIG. 1). The SMPS 203 comprises a DC-boost controller 800, a MOSFET 801, a Schottky diode 802, an inductor 803, an output bulk capacitance 804, and resistors 805A, 805B arranged in series. The DC-boost controller 800 creates the variable rail voltage VR for the signal amplifier 200 based on the power instruction signal SP received from the envelope detector 202 through a resistor RC. In this regard, the DC-boost controller 800 directs the MOSFET 801 between on and off states at a frequency to generate and maintain the variable rail voltage VR while maintaining acceptable levels of electrical current. The frequency may be, for example, in a range from one-hundred (100) kilohertz to ten (10) megahertz. In some configurations, the DC-boost controller 800 includes an external network for determining and regulating the DC output voltage. In this configuration, the signal SP is typically summed into the external network such that the signal SP alters the control voltage, and in turn changes the output voltage in a predictable and controlled manner. When the MOSFET 801 operates in the "on" state, the power supply 130 supplies current through the inductor 803 and the MOSFET 801. Current increases based on operating characteristics of the inductor 803 and thereby energy is stored in the inductor 803. When the current in the MOSFET 801 and the inductor 803 reach a current limit as determined by feedback provided to the DC-boost controller 800, then the MOSFET 801 is switched to the "off" state. This feedback may be a feedback voltage VF created between the resistors 805A, 805B arranged in series, wherein the resistors 805A, 805B are coupled in parallel to the variable rail voltage VR. When the MOSFET 801 is turned to the "off" state, then the energy accumulated in the inductor 803 is discharged as current directed through the Schottky diode 802 and to the output bulk capacitance 804. Consistent with this approach, the DC-boost controller 800 may utilize a pulse width modulation (PWM) approach to control electrical current in the inductor 803, based on the feedback voltage VF, and therefore regulate the variable rail voltage VR provided to the signal amplifier 200 for the controlled and efficient operation and high-fidelity amplification of the input signal 104 by the signal amplifier 200.

Figure 9:
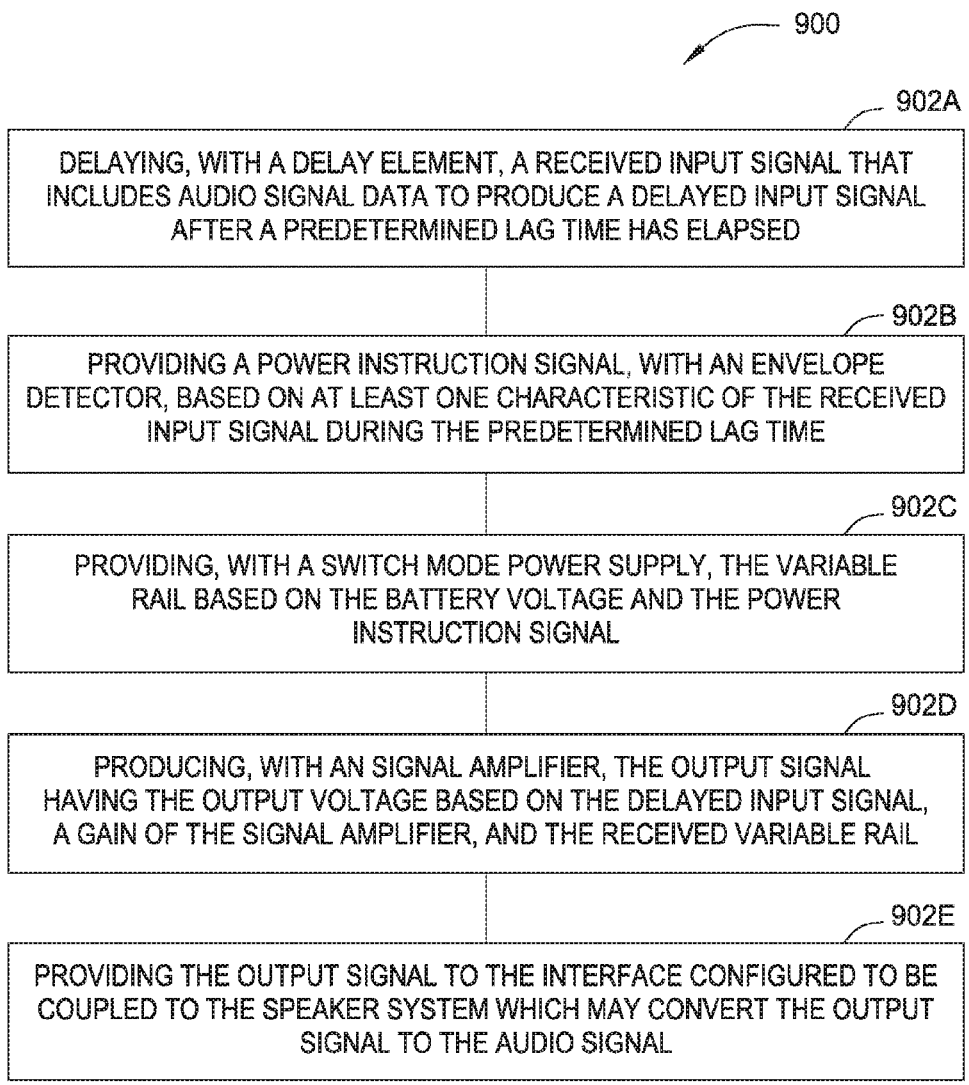
FIG. 9 illustrates an exemplary method for providing an output signal with an audio device, according to an embodiment of the disclosure provided herein.

Now that the audio processing device 117 of the audio delivery system 100 has been introduced, an exemplary method 900 for providing the output signal 106 with the audio processing device 117 is now disclosed. FIG. 9 is a flowchart of the exemplary method 900 and is discussed using the terminology developed above. The method 900 includes delaying, with the signal delay element 201, the received input signal 104 that includes the audio signal data $V_{IN}$ to produce the delayed input signal 204 after the predetermined lag time D has elapsed (operation 902A of FIG. 9). The method 900 also includes providing the power instruction signal SP, using the envelope detector 202, based on the at least one characteristic 401, 402 of the received input signal 104 during the predetermined lag time D (operation 902B of FIG. 9). The method 900 also includes providing, with a switch mode power supply 203, the variable rail voltage VR based on a battery voltage and the power instruction signal SP (operation 902C of FIG. 9). The method 900 also includes producing, with the signal amplifier 200, the output signal 106 having the output voltage $V_{OUT}$ based on the delayed input signal 204, the gain of the signal amplifier 200, and the received variable rail voltage VR (operation 902D of FIG. 9). The method 900 may include providing the output signal 106 to the interface 505 configured to be coupled to the speaker system 111 which may convert the output signal 106 to the audio signal 103 (operation 902E of FIG. 9). In this manner, the output signal 106 may be amplified from the input signal 104 with high fidelity and desired power efficiency to prolong the operation of the audio delivery device 100 before recharging or replacing the power source 130.

Figure 10:
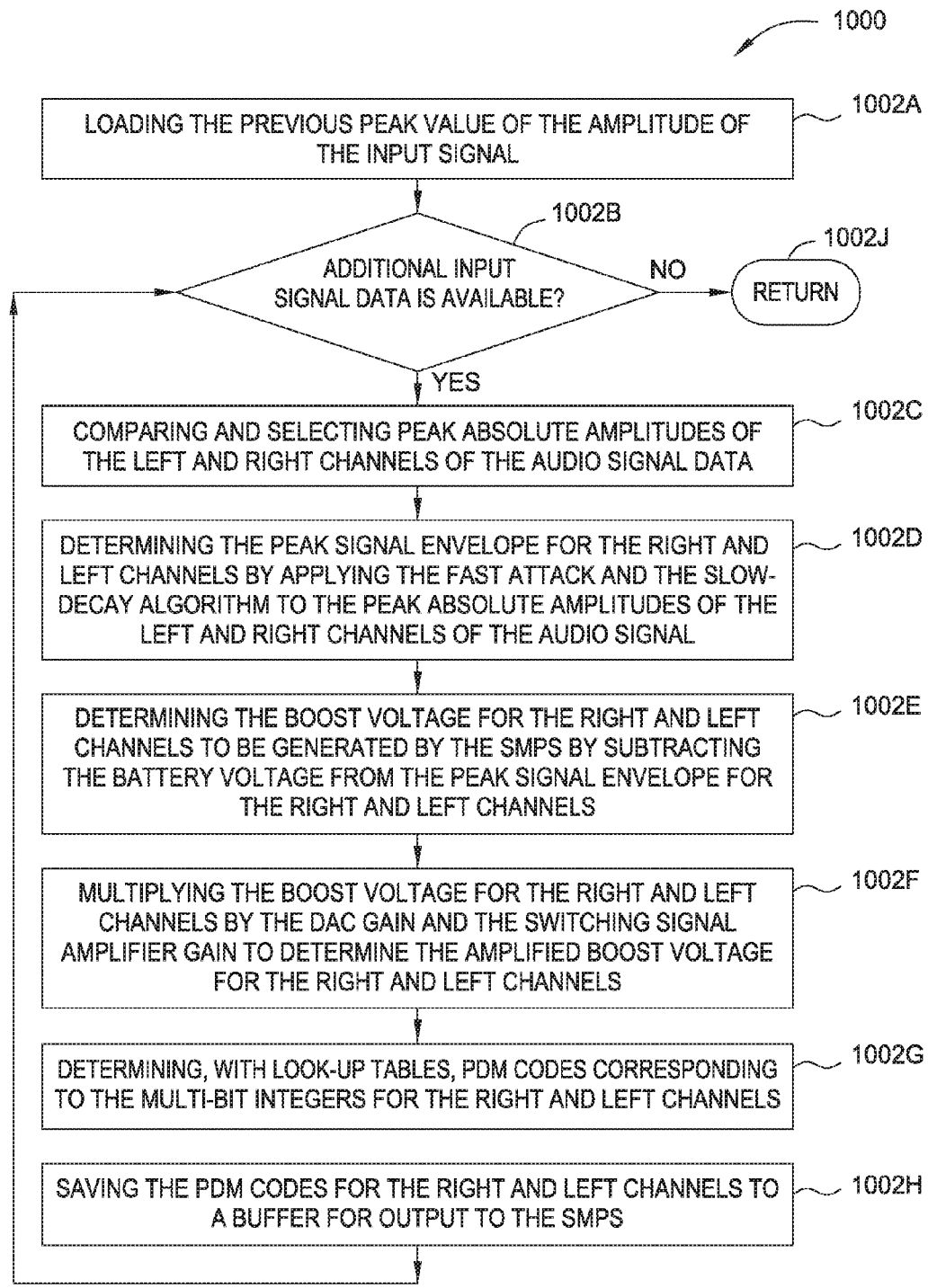
FIG. 10 illustrates a method of determining the contents of a power instruction signal that is to be sent to the switch mode power supply, according to an embodiment of the disclosure provided herein.

In another embodiment, a method 1000 is also disclosed that might be used by the envelope detector 202 as an algorithm for determining the power instruction signal SP. FIG. 10 is a flowchart of the method 1000 and is discussed using the terminology developed above. The method 1000 includes repeating a set of operations to continuously update the power instruction signal SP. The method 1000 includes loading the previous peak value of the amplitude of the input signal 104 (operation 1002A of FIG. 10). The previous peak amplitude is determined during a previous predetermined lag time and may be found within a frame that contains samples of the input signal 104. The method 1000 also includes determining whether there is additional input signal data available for the current frame of samples (operation 1002B of FIG. 10) of the input signal 104. If not, then the method ends (operation 1002J of FIG. 10), otherwise the method 1000 proceeds to comparing and selecting absolute values of the peak amplitudes of the left and right channels of the audio signal found within the current frame (operation 1002C of FIG. 10). The method 1000 also includes determining the peak signal envelope for the right and left channels by applying the fast attack and the slow-decay algorithm to the peak absolute amplitudes of the left and right channels of the audio signal (operation 1002D of FIG. 10). The method 1000 also includes determining the boost voltage for the right and left channels to be generated by the SMPS 203 by subtracting the battery voltage $V_{BAT}$ from the peak signal envelope for the right and left channels (operation 1002E of FIG. 10). The method 1000 also includes multiplying the boost voltage for the right and left channels by the DAC gain and the switching signal amplifier gain to determine the amplified boost voltage for the right and left channels (operation 1002F of FIG. 10). The method 1000 also includes determining, with look-up tables, PDM codes corresponding to the multi-bit integers for the right and left channels (operation 1002G of FIG. 10). The method 1000 also includes saving the PDM codes for the right and left channels to a buffer for output to the SMPS 203 (operation 1002H of FIG. 10). In this manner, the envelope detector 202 may determine the power instruction signal SP for the SMPS 203 to provide the variable rail voltage VR for improved efficiency of the signal amplifier 200.

One embodiment of the disclosure may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. An audio device, comprising:
an envelope detector configured to receive an input signal that includes audio signal data distributed over a first time period, and produce a power instruction signal based on at least one characteristic of the input signal detected within the time period;
a power supply providing a battery voltage;
a switch mode power supply configured to generate a variable rail voltage, wherein the generated variable rail voltage is based on the battery voltage and the power instruction signal received from the envelope detector during the first time period; and
a switching signal amplifier configured to receive the generated variable rail voltage and the input signal, and produce an output signal that is based on the received input signal and a gain of the switching signal amplifier, wherein the output signal comprises a plurality of peak output voltages formed at different times within a second time period, and
wherein a difference between the generated variable rail voltage and a magnitude of the peak output voltage of the plurality of peak output voltages is equal to or within a fixed buffer level at each of the different times.

2. The audio device of claim 1, further comprising:
a signal delay element configured to receive the input signal and produce a delayed input signal, which includes the audio signal data, after a predetermined lag time has elapsed, and
wherein the input signal received by the switching signal amplifier comprises the delayed input signal.

3. The audio device of claim 2, wherein the predetermined lag time is in a range from 1 microsecond to 300 milliseconds.

4. The audio device of claim 2, wherein the envelope detector comprises a digital signal processor (DSP) module.

5. The audio device of claim 4, wherein the signal delay element is a digital signal delay element that is formed within the digital signal processor (DSP) module.

6. The audio device of claim 4, wherein the predetermined lag time is equal to or greater than an input signal sampling rate performed by the digital signal processor (DSP) module.

7. The audio device of claim 1, wherein the switching signal amplifier comprises a class-D signal amplifier.

8. The audio device of claim 1, wherein the envelope detector is further configured to:
   detect a plurality of local amplitude peaks associated with the input signal, wherein the plurality of local amplitude peaks comprise a first local amplitude peak and a second local amplitude peak, and the first local amplitude peak occurs before the second local amplitude peak in time, and
   vary the produced power instruction signal using a decay algorithm when a magnitude of the first local amplitude peak is greater than a magnitude of the second local amplitude peak.

9. The audio device of claim 8, wherein the envelope detector is further configured to vary the power instruction signal using a fast attack algorithm when a magnitude of the first local amplitude peak is less than a magnitude of the second local amplitude peak.

10. The audio device of claim 8, wherein the varied power instruction signal formed by the decay algorithm comprises an exponential decay.

11. The audio device of claim 8, wherein the switch mode power supply generates an adjustable incremental voltage so that the rail voltage is a sum of the adjustable incremental voltage and a voltage of the battery output voltage.

12. A method of conserving power in an audio device, comprising:
   receiving, by a digital signal processor, an input signal that includes audio signal data distributed over a first time period;
   generating a power instruction signal, using an envelope detector within the digital signal processor, that is based on at least one characteristic of the received input signal detected within the first time period;
   delivering, from a switch mode power supply, a variable rail voltage signal to a switching amplifier, wherein the variable rail voltage signal is derived from a voltage received from a battery and the generated power instruction signal; and
   generating, with the switching signal amplifier, an output signal having an output voltage based on the input signal and a gain of the switching signal amplifier, wherein the output signal comprises a plurality of peak output voltages formed at different times within a second time period,
   wherein a difference between the generated variable rail voltage and a magnitude of the peak output voltage of the plurality of peak output voltages is equal to or within a fixed buffer level at each of the different times.

13. The method of claim 12, further comprising:
   delaying the input signal provided to the switching signal amplifier a predetermined lag time, wherein the generated output signal is based on the delayed input signal.

14. The method of claim 13, wherein the predetermined lag time is in a range from 1 microsecond to 300 milliseconds.

15. The method of claim 13, wherein the second time period is shifted in time relative to the first period of time at least an amount equal to the predetermined lag time.

16. The method of claim 13, wherein the delayed input signal is performed by a digital signal processor (DSP) module, wherein the predetermined lag time is equal to or greater than an input signal sampling rate performed by the digital signal processor (DSP) module.

17. The method of claim 12, wherein the switching signal amplifier comprises a class-D signal amplifier.

18. The method of claim 12, further comprises:
   detecting a plurality of local amplitude peaks associated with the input signal, wherein the plurality of local amplitude peaks comprise a first local amplitude peak and a second local amplitude peak, and the first local amplitude peak occurs before the second local amplitude peak in time, and
   adjusting the power instruction signal using a decay algorithm when a magnitude of the first local amplitude peak is greater than a magnitude of the second local amplitude peak.

19. The method of claim 18, wherein the adjusted power instruction signal comprises an exponential decay that is generated by the decay algorithm.

20. The method of claim 12, wherein the generated variable rail voltage comprises a plurality of incremental voltage levels that are based on an output voltage of a battery.

* * * * *